(12) United States Patent  
Okuda et al.

(10) Patent No.: US 7,767,549 B2
(45) Date of Patent: Aug. 3, 2010

(54) METHOD OF MANUFACTURING BONDED WAFER

(75) Inventors: Hidehiko Okuda, Yamagata (JP); Tatsumi Kusaba, Yamagata (JP); Akihiko Endo, Yamagata (JP)

(73) Assignee: Sumco Corporation, Tokyo (JP)

( * ) Notice: Subject to any disclaimer, the term of this patent is extended or adjusted under 35 U.S.C. 154(b) by 0 days.

(21) Appl. No.: 11/957,674

(22) Filed: Dec. 17, 2007

(65) Prior Publication Data

US 2008/0213974 A1 Sep. 4, 2008

(30) Foreign Application Priority Data

Dec. 26, 2006 (JP) ............... 2006-350138
Nov. 6, 2007 (JP) ............... 2007-287991

(51) Int. Cl.
*H01L 21/30* (2006.01)
*H01L 21/46* (2006.01)

(52) U.S. Cl. ............... 438/459; 438/455; 438/458; 438/506; 438/509; 438/528; 257/E21.122

(58) Field of Classification Search ............... 438/455, 438/458, 459, 406, 506, 509, 528, 977; 257/E21.122
See application file for complete search history.

(56) References Cited

U.S. PATENT DOCUMENTS 5,374,564 A * 12/1994 Bruel ............... 438/455
6,140,210 A * 10/2000 Aga et al. ............... 438/458
6,350,703 B1 * 2/2002 Sakaguchi et al. ............... 438/766
6,436,846 B1 8/2002 Tews et al.
6,486,008 B1 * 11/2002 Lee ............... 438/149
6,489,241 B1 * 12/2002 Thilderkvist et al. ............... 438/689
6,566,233 B2 * 5/2003 Yokokawa et al. ............... 438/455

(Continued)

FOREIGN PATENT DOCUMENTS

CN 1257306 A 6/2000

(Continued)

OTHER PUBLICATIONS

JPO Notice of Rejection for Patent Application 2007-287991 drafted Dec. 17, 2008 Submitted by Applicant but not cited on any IDS.*

(Continued)

*Primary Examiner*—Matthew Smith
*Assistant Examiner*—John M Parker
(74) *Attorney, Agent, or Firm*—Greenblum & Bernstein, P.L.C.

(57) ABSTRACT

The present invention provides a method of manufacturing a bonded wafer. The method comprises an oxidation step in which an oxide film is formed on at least one surface of a base wafer, a bonding step in which the base wafer on which the oxide film has been formed is bonded to a top wafer to form a bonded wafer, and a thinning step in which the top wafer included in the bonded wafer is thinned. The oxidation step comprises heating the base wafer to a heating temperature ranging from 800 to 1300° C. at a rate of temperature increase ranging from 1 to 300° C./second in an oxidizing atmosphere, and the bonding step is carried out so as to position the oxide film formed in the oxidation step at an interface of the top wafer and the base wafer.

7 Claims, 1 Drawing Sheet

Cross-section of the wafer before heat treatment in reducing atmosphere

Cross-section of the wafer after heat treatment in reducing atmosphere

U.S. PATENT DOCUMENTS

| | | | |
|---|---|---|---|
| 6,596,610 B1 * | 7/2003 | Kuwabara et al. | 438/458 |
| 6,756,286 B1 * | 6/2004 | Moriceau et al. | 438/459 |
| 2004/0185680 A1 * | 9/2004 | Hauf et al. | 438/795 |
| 2004/0259328 A1 * | 12/2004 | Ito et al. | 438/459 |
| 2005/0118789 A1 | 6/2005 | Aga et al. | |
| 2007/0184631 A1 * | 8/2007 | Nakamura et al. | 438/455 |
| 2007/0287205 A1 | 12/2007 | Kubota | |

FOREIGN PATENT DOCUMENTS

| | | |
|---|---|---|
| EP | 1187216 | 3/2002 |
| EP | 1278245 | 1/2003 |
| EP | 1818971 | 8/2007 |
| JP | 02-001914 | 1/1990 |
| JP | 03-053530 | 3/1991 |
| JP | 11-135508 A | 5/1999 |
| JP | 2000-036445 | 2/2000 |
| JP | 2000-091259 | 3/2000 |
| JP | 2004-153081 A | 5/2004 |
| JP | 2004-221198 A | 8/2004 |
| JP | 2006 156770 | 6/2006 |
| JP | 2006-165062 A | 6/2006 |
| WO | 2006/059586 | 6/2006 |

OTHER PUBLICATIONS

English Language Abstract of JP 2000-036445, Dated Feb. 2, 2000.
English Language Abstract of JP 2000-091259, Dated Mar. 31, 2000.
English Language Abstract of JP 02-001914, Dated Jan. 8, 1990.
English language Abstract of JP 2006-1565770, Dated Jun. 15, 2006.
U.S. Appl. No. 11/851,065 to Nishihata et al, which was filed on Sep. 6, 2007.
U.S. Appl. No. 11/955,765 to Morimoto et al., which was filed on Dec. 13, 2007.
English language Abstract of JP 2004-153081 A.
English language Abstract of JP 2004-221198 A.
English language Abstract of JP 11-135508 A.
English language Abstract of JP 2006-165062 A.
English language Abstract of JP 03-053530.

* cited by examiner

Cross-section of the wafer before heat treatment in reducing atmosphere

Cross-section of the wafer after heat treatment in reducing atmosphere

METHOD OF MANUFACTURING BONDED WAFER

CROSS-REFERENCE TO RELATED APPLICATIONS

This application claims the benefit of priority under 35 USC 119 to Japanese Patent Applications No. 2006-350138 filed on Dec. 26, 2006 and No. 2007-287991 filed on Nov. 6, 2007, which are expressly incorporated herein by reference in their entirety.

BACKGROUND OF THE INVENTION

1. Field of the Invention

The present invention relates to a method of manufacturing a bonded wafer such as an SOI wafer having a thin BOX layer and a DSB wafer.

2. Discussion of the Background

In contrast to conventional silicon wafers, silicon-on-insulator (SOI) wafers afford the advantages of device isolation, reduced parasitic capacitance between device and substrate, and the ability to form three-dimensional structures. Utilizing these advantages, SOI wafers have been employed in high-speed, low power consumption LSIs. (large scale integration integrated circuit) and the like in recent years.

A conventional SOI wafer is comprised of two wafers bonded through a relatively thick (for example, about 1,500 Angstrom) oxide film. However, with the use of new devices in recent years, demand has been increasing for SOI wafers having thin oxide films and direct silicon bonding (DSB) wafers in which two wafers are directly bonded without an oxide film.

It is known that multiple voids form on the bonding surface when two wafers are directly bonded to manufacture a DSB wafer. To reduce these voids, Japanese Unexamined Patent Publication (KOKAI) No. 2006-156770 or English language family member EP 1 818 971 A1, which are expressly incorporated herein by reference in their entirety, proposes a method in which the two wafers are bonded through a thin oxide film, after which a heat treatment is conducted to remove the interface oxide film.

Normally, a vertical furnace is used to form a BOX oxide film. However, when employing a vertical furnace, treatment for at least several tens of minutes is required to produce an oxide film. Further, in vertical furnaces, the higher the oxidation temperature, the more rapid the rate of growth of the oxide film, making it difficult to control the film thickness. Accordingly, forming the thin oxide films that have been in ever greater demand in recent years with uniform thickness in vertical ovens requires low-temperature processing. However, low-temperature processing presents the risks of the growth of precipitation nuclei in the wafer and excessive precipitation, resulting in the problem of failed lithography and the like in device processing.

SUMMARY OF THE INVENTION

An aspect of the present invention provides for both a high-quality SOI wafer having a thin BOX oxide film with a uniform thickness, and a high-quality DSB wafer.

The present inventors conducted extensive research, resulting in the discovery that by rapidly raising the temperature in an oxidizing atmosphere and heating a wafer to a prescribed temperature to form an oxide film, it was possible to rapidly form a thin BOX oxide film of equal to or less than 30 nm in thickness, or even an ultra thin BOX oxide film of equal to or less than 2 nm in thickness with a uniform thickness, for example, and to reduce the bulk micro defects (BMDs) in the wafer; the present invention was devised on this basis.

An aspect of the present invention relates to a method of manufacturing a bonded wafer comprising:

an oxidation step in which an oxide film is formed on at least one surface of a base wafer, a bonding step in which the base wafer on which the oxide film has been formed is bonded to a top wafer to form a bonded wafer, and a thinning step in which the top wafer included in the bonded wafer is thinned, wherein the above oxidation step comprises heating the base wafer to a heating temperature ranging from 800 to 1300° C. at a rate of temperature increase ranging from 1 to 300° C./second in an oxidizing atmosphere, and the above bonding step is carried out so as to position the oxide film formed in the above oxidation step at an interface of the top wafer and the base wafer.

In one embodiment, the oxidation step can be carried out in a Rapid Thermal Processor.

In one embodiment, the oxidation step can be carried out so as to form an oxide film on at least one surface of the base wafer to the extent that the total thickness of the oxide film positioned at the interface is equal to or less than 30 nm.

In one embodiment, the heating temperature in the oxidation step can range from 1000 to 1200° C.

In one embodiment, the oxidation step can comprise holding the base wafer for 1 to 3 minutes at the heating temperature in the oxidation step.

In one embodiment, the oxidation step can further comprise lowering a temperature at a rate of temperature reduction ranging from 50 to 100° C./second.

In one embodiment, the thinning step can be conducted by, prior to the bonding step, implanting light element ions into a top wafer to form an ion implantation layer in the top wafer, and following the bonding step, subjecting the bonded wafer to heat treatment to separate a portion of the top wafer from the bonded wafer at the ion implantation layer as boundary.

In one embodiment, the thinning step can be conducted by, prior to the bonding step, implanting oxygen ions into a top wafer to form an ion implantation layer in the top wafer, and following the bonding step, removing a portion of the top wafer from the bonded wafer at the ion implantation layer as boundary by grinding, polishing and/or etching.

In one embodiment, the method of manufacturing can further comprise removing the oxide film present at the interface by subjecting the bonded wafer to heat treatment in a non-oxidizing atmosphere.

The present invention permits the rapid manufacturing of a BOX oxide film of uniform thickness. By rapidly conducting the oxidation treatment at a high temperature, it is possible to reduce the BMD density in the wafer.

According to the present invention, voids generated in the bonding step and in the step of thinning the top wafer can be reduced, thereby providing a high-quality bonded wafer.

Other exemplary embodiments and advantages of the present invention may be ascertained by reviewing the present disclosure and the accompanying drawings.

BRIEF DESCRIPTION OF THE DRAWINGS

The present invention will be described in the following text by the exemplary, non-limiting embodiments shown in the figures, wherein.

DESCRIPTIONS OF THE EMBODIMENTS

Figure 1:
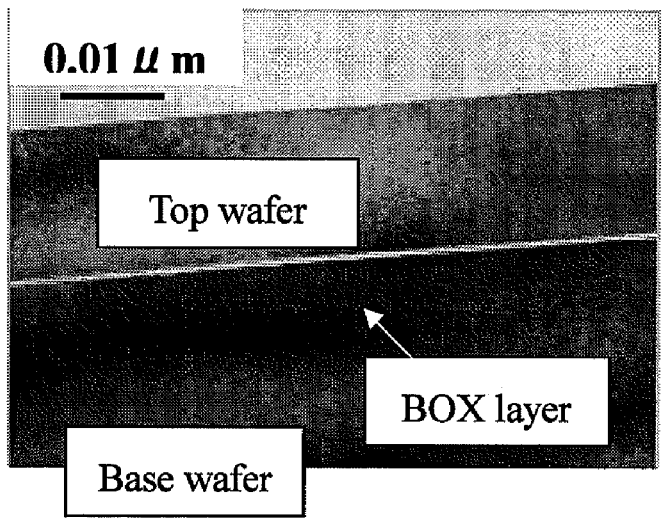
FIG. 1 shows TEM images of wafer cross-sections before and after the heat treatment in Example 7.
Figure 1:
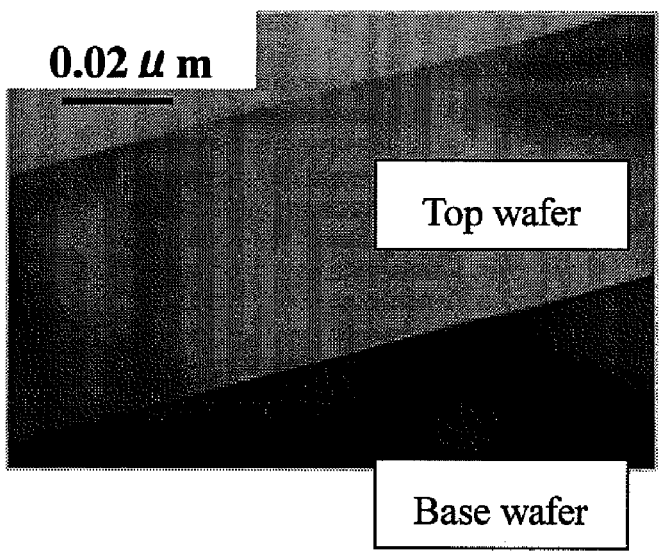

The following preferred specific embodiments are, therefore, to be construed as merely illustrative, and non-limiting to the remainder of the disclosure in any way whatsoever. In this regard, no attempt is made to show structural details of the present invention in more detail than is necessary for fundamental understanding of the present invention; the description taken with the drawings making apparent to those skilled in the art how several forms of the present invention may be embodied in practice.

The method of manufacturing a bonded wafer of the present invention comprises:

(1) an oxidation step in which an oxide film is formed on at least one surface of a base wafer, (2) a bonding step in which the base wafer on which the oxide film has been formed is bonded to a top wafer to form a bonded wafer, and (3) a thinning step in which the top wafer included in the bonded wafer is thinned.

The oxidation step comprises heating the base wafer to a heating temperature ranging from 800 to 1300° C. at a rate of temperature increase ranging from 1 to 300° C./second in an oxidizing atmosphere, and the bonding step is carried out so as to position the oxide film formed in the oxidation step at an interface of the top wafer and the base wafer.

Each of these steps will be described below.

(1) Oxidation Step

In the method of manufacturing a bonded wafer of the present invention, an oxide film is formed on at least one surface of a base wafer. The oxide film that is formed in this step is positioned at the interface of two wafers in a subsequent bonding step. It is thus possible to obtain an SOI wafer having a buried oxide film.

Two silicon wafers sliced from a single boron-doped silicon ingot grown by the CZ method or the like can be employed as the bonded wafers, for example. When obtaining a DSB wafer by removing the oxide film after bonding two wafers through an oxide film, a silicon wafer is employed as the base wafer and a wafer that is heterogeneous with respect to the base wafer or a silicon wafer of different orientation from the base wafer can be employed as the top wafer. Further, to reduce BMDs, described further below, it is desirable to bond wafers of reduced oxygen concentration. The oxygen concentration for both the base wafer and top wafer is preferably $8 \times E+17$ atoms/cm$^3$ to $14 \times E+17$ atoms/cm$^3$, more preferably $10 \times E+17$ atoms/cm$^3$ to $12 \times E+17$ atoms/cm$^3$.

The oxidation step comprises heating the wafer on which the oxide film is to be formed to a heating temperature ranging from 800 to 1300° C. at a rate of temperature increase ranging from 1 to 300° C./second in an oxidizing atmosphere.

The upper limit of the heating temperature in a vertical oven (resistance heating, batch type) commonly employed in the forming of BOX oxide films is about 1,200° C. and the rate of temperature increase is generally about 10 to 20° C./minute. Thus, approximately several tens of minutes are required to form a BOX oxide film. Further, as stated above, it is necessary to conduct the treatment at low temperature to form a thin oxide film of uniform thickness in a vertical furnace. However, the use of low-temperature processing causes $SiO_2$ precipitation nuclei to grow inside the wafer, resulting in excessive precipitation. Thus, bulk micro defects (BMDs) increase in the wafer, potentially causing lithographic failure in device processing. In a conventionally employed vertical furnace, it is difficult to achieve both the formation of an oxide film of uniform thickness (particularly a thin oxide film) and a reduced BMD density.

By contrast, in the present invention, heating is conducted to a temperature of 800 to 1,300° C. at a rate of temperature increase that is much more rapid that when employing a vertical oven. Thus, it is possible to rapidly form a BOX film of uniform film thickness without causing an increase in the BMD density.

When forming a thin oxide film at the above rate of temperature increase of less than 1° C./second, it is difficult to maintain film thickness uniformity. Additionally, when the rate of temperature increase exceeds 300° C./second, there is a risk of generating slips in the wafer. When the heating temperature is less than 800° C., it becomes difficult to form a thin oxide film of uniform thickness. When exceeding 1,300° C., slips may be generated in the wafer.

The oxidation step can be conducted by RTP oxidation in a lamp-type Rapid Thermal Processor (RTP). In an RTP, a lamp such as an infrared lamp is employed to heat a single wafer, permitting a rapid temperature increase. The use of an RTP permits a rapid temperature increase and reduction, permitting heating at the aforementioned rate of temperature increase, and thus permitting the rapid formation of an oxide film of uniform thickness without increasing the BMD density.

The above oxidation step is a suitable method for forming a thin, uniform BOX oxide film, and preferably applied, for example, when obtaining a bonded wafer having a BOX oxide film thickness of equal to or less than 30 nm, further, equal to or less than 2 nm, or, for example, 0.5 to 2 nm.

It is desirable to adjust heating and cooling conditions such as the rate of temperature increase and reduction, the temperature and maintenance period following heating in the oxidation step to effectively reduce the BMD. The following heating and cooling process, for example, is desirable to form an oxide film (preferably of equal to or less than 2 nm in thickness) on the base wafer: heating to a temperature of 800 to 1,300° C., preferably 800 to 1,200° C., more preferably 1,000 to 1,200° C., at a rate of temperature increase of 1 to 300° C./second, preferably 50 to 100° C./second, more preferably 75 to 90° C./second, maintaining this heating temperature for 1 to 3 minutes, preferably 1 to 2 minutes; and reducing the temperature to 500 to 700° C., preferably 500 to 600° C., at a rate of temperature reduction of 50 to 100° C./second, preferably 75 to 90° C./second. It is possible to preheat the oven before conducting the oxidation step. The preheat temperature is, for example, about 500 to 700° C.

The thickness of the oxide film that is formed can be controlled by adjusting the heating and cooling conditions and the concentration of oxygen in the oxidizing atmosphere. The concentration of oxygen in the oxidizing atmosphere can be 10 to 100 percent, preferably 50 to 100 percent. Examples of gases that may also be present are nitrogen and argon; there is no specific limitation in this regard.

(2) Bonding Step

Following the oxidation step, the top wafer and base wafer are bonded so that the oxide film that has been formed is positioned between the two wafers. The bonding step may be conducted at room temperature using a jig such as that commonly employed in wafer bonding, for example. The two wafers may be adhered without employing adhesive or the like by polishing the surfaces of both wafers to a mirror surface.

(3) Thinning Step

Following the bonding step, a thinning step is conducted in which the top wafer is thinned. The thinning step can be conducted by an ion implantation separation method, grinding, polishing, etching, or the like. To highly adjust the thickness of the remaining top wafer when thinning the top wafer, the use of an ion implantation separation method or a thinning method employing an oxygen ion-implantation layer, described further below, is desirably employed. When employing an ion implantation separation method, ions are implanted prior to the bonding step and the wafer is heat treated following the bonding step to separate a portion of the top wafer at the ion implantation layer as boundary.

In the above ion implantation, light element ions (such as hydrogen ions, noble gas ions, or a mixture of hydrogen and noble gas ions) are implanted into the top wafer to form an ion implantation layer in the top wafer. The ion implantation can be conducted using a known ion implantation device. The acceleration voltage during ion implantation can be 10 to 100 keV, for example. When productivity is taken into account, a low level of ion implantation is desirable. However, an excessively low level renders separation difficult during the subsequent heat treatment. Based on these considerations, the level of ion implantation is, for example, $2\ e^{16}$ to $1\ e^{17}/cm^2$, preferably $5\ e^{16}$ to $1\ e^{17}/cm^2$.

The temperature of the heat treatment for separating the top wafer is generally equal to or higher than 300° C., preferably 350 to 500° C. When the temperature of the heat treatment falls within this range, air bubbles can develop in the ion implantation layer, forming a continuous layer that causes separation to take place at the ion implantation layer as boundary. The heat treatment period can be from one minute to one hour, and is preferably 1 to 30 minutes. The rate of temperature increase is, for example, 0.5 to 10° C./minute, preferably 1 to 5° C./minute. The heat treatment can be conducted using a known heat treatment device.

In the thinning step employing a thinning method using an oxygen ion implantation layer, oxygen ions are implanted into the top wafer prior to bonding to form an ion implantation layer in the top wafer. After the bonding step, grinding, polishing, and/or etching is used to remove a portion of the top wafer at the ion implantation layer as boundary.

Following the thinning step, the bonded wafers can be heat treated in a non-oxidizing atmosphere to remove the oxide film present at the bonding interface. This is done because the heat treatment causes oxygen in the wafers to diffuse outward, lowering the concentration and causing the oxide film present in this region of lowered oxygen concentration to diffuse into the wafer. In this manner, a wafer (DSB wafer) comprised of two directly bonded wafers can be obtained.

The non-oxidizing atmosphere is, for example, a reducing atmosphere or an inert atmosphere, such as a nitrogen atmosphere, argon atmosphere, or hydrogen atmosphere. The conditions of the above heat treatment are desirably set by taking into account the thickness of the oxide film present at the wafer interface and the concentration of oxygen in the wafer. The heat treatment temperature, for example, can be 1,000 to 1,200° C., and is desirably 1,100 to 1,150° C. The heat treatment period is, for example, 0.5 to 2 hours, desirably 1 to 2 hours. The top wafer can be rendered a defect-free layer by the above heat treatment. Furthermore, the BMD density of the interior of the base wafer can be reduced by the above oxidation treatment. Therefore, it becomes possible to obtain a high-quality DSB wafer.

Subsequently, the top wafer lateral surfaces and base wafer lateral surfaces of the bonded wafer obtained can be polished to obtain a bonded wafer of desired thickness.

As set forth above, the method of manufacturing a bonded wafer of the present invention can be used to achieve a thin oxide film of a uniform thickness of equal to or less than 30 nm, for example, or even equal to or less than 2 nm, and to reduce the BMD density in the base wafer to equal to or less than $1\ E+5/cm^2$, for example, or even $1\ E+2/cm^2$ to $1\ E+5/cm^2$. The BMD density can be measured by the light etching method.

EXAMPLES

The present invention will be described in detail below based on examples. However, the present invention is not limited to the examples.

Example 1

(1) Preparation of Top and Base Wafers

Two silicon wafers measuring 725 micrometers in thickness, having a diameter of 200 mm, a resistivity of 20 Ohms·cm, and an oxygen concentration of $12\ E+17/cm^3$ were prepared by slicing from a boron-doped silicon ingot grown by the CZ method. Subsequently, the silicon wafers were polished to a mirror finish by a known method. One of the silicon wafers was employed as the top wafer and the other as the base wafer.

(2) Formation of a BOX Oxide Film

The variation and average value of the thickness of an oxide film—formed on the surface of the silicon wafer being employed as base wafer with an RTP (made by Mattson Corp., 100 percent oxygen atmosphere in the processor) by increasing the temperature from 600° C. to 900° C. at 50° C./second, maintaining 900° C. for one minute, and then decreasing the temperature to 600° C. at 50° C./second—were evaluated with a reflective-type film thickness measuring device. Table 1 gives the difference between the maximum value and minimum value of the film thickness (film thickness range) at 121 points on the surface, and the average film thickness.

(3) Ion Implantation

The silicon wafer being employed as top wafer was set in the vacuum chamber of an ion implantation device and rotation was begun. Under conditions of 40 keV and $5.0\ E\ 16/cm^2$, implantation was conducted with a hydrogen ion beam to form an ion implantation layer.

(4) Bonding

The top wafer and base wafer were bonded so that the BOX oxide film was positioned at the interface. The BMD density in the base wafer of the bonded wafer obtained was evaluated by the light etching method. The results are shown in Table 1.

Example 2

A bonded wafer was prepared by the same method as in Example 1 with the exception that a BOX oxide film was formed on the surface of the silicon wafer being employed as the base wafer with an RTP (made by Mattson Corp., 100 percent oxygen atmosphere in the processor) by increasing the temperature from 600° C. to 1,100° C. at 50° C./second, maintaining 1,100° C. for one minute, and then decreasing the temperature to 600° C. at 50° C./second.

Example 3

A bonded wafer was prepared by the same method as in Example 1 with the exception that the oxygen concentration of the top and base wafers was changed to 13 E+17/cm$^3$.

Example 4

A bonded wafer was prepared by the same method as in Example 3 with the exception that a BOX oxide film was formed on the surface of the silicon wafer being employed as the base wafer with an RTP (made by Mattson Corp., 100 percent oxygen atmosphere in the processor) by increasing the temperature from 600° C. to 1,100° C. at 50° C./second, maintaining 1,100° C. for one minute, and then decreasing the temperature to 600° C. at 50° C./second.

Example 5

A bonded wafer was prepared by the same method as in Example 1 with the exception that the oxygen concentration of the top and base wafers was changed to 14 E+17/cm$^3$.

Example 6

A bonded wafer was prepared by the same method as in Example 5 with the exception that a BOX oxide film was formed on the surface of the silicon wafer being employed as the base wafer with an RTP (made by Mattson Corp., 100 percent oxygen atmosphere in the processor) by increasing the temperature from 600° C. to 1,100° C. at 50° C./second, maintaining 1,100° C. for one minute, and then decreasing the temperature to 600° C. at 50° C./second.

Comparative Example 1

A bonded wafer was prepared by the same method as in Example 1 with the exception that a BOX oxide film was formed with a vertical furnace (with a 100 percent oxygen atmosphere within the furnace) by increasing the temperature from 700° C. to 800° C. at 5° C./minute, maintaining 800° C. for 6 minutes, and then decreasing the temperature to 700° C. at 2.5° C./minute.

Comparative Example 2

A bonded wafer was prepared by the same method as in Example 3 with the exception that a BOX oxide film was formed with a vertical furnace (with a 100 percent oxygen atmosphere within the furnace) by increasing the temperature from 700° C. to 800° C. at 5° C./minute, maintaining 800° C. for 6 minutes, and then decreasing the temperature to 700° C. at 2.5° C./minute.

Comparative Example 3

A bonded wafer was prepared by the same method as in Example 5 with the exception that a BOX oxide film was formed with a vertical furnace (with a 100 percent oxygen atmosphere within the furnace) by increasing the temperature from 700° C. to 800° C. at 5° C./minute, maintaining 800° C. for 6 minutes, and then decreasing the temperature to 700° C. at 2.5° C./minute.

TABLE 1

| | Oxygen concentration of base wafer (×E + 17/cm$^3$) | Heating temp. (° C.) | Average film thickness (nm) | Film Thickness Range (nm) | BMD density (cm$^2$) |
|---|---|---|---|---|---|
| Ex. 1 | | 900 | 2.1 | 0.22 | 9.76E+02 |
| Ex. 2 | 12 | 1100 | 2.3 | 0.23 | 1.43E+02 |
| Comp. Ex. 1 | | 800 | 2.2 | 0.25 | 9.42E+03 |
| Ex. 3 | | 900 | 2.3 | 0.24 | 2.60E+04 |
| Ex. 4 | 13 | 1100 | 2.0 | 0.22 | 3.48E+03 |
| Comp. Ex. 2 | | 800 | 2.4 | 0.26 | 2.20E+05 |
| Ex. 5 | | 900 | 2.2 | 0.26 | 1.24E+05 |
| Ex. 6 | 14 | 1100 | 2.2 | 0.23 | 1.53E+04 |
| Comp. Ex. 3 | | 800 | 2.1 | 0.28 | 9.54E+05 |

A comparison of Examples and Comparative Examples having base wafers of identical oxygen concentration in Table 1 reveals that oxidation treatment comprising heating to 800 to 1,300° C. at a rate of temperature increase of 50 to 100° C./second permitted the rapid formation of oxide films of uniform thickness and permitted a reduction of the BMD density in the base wafer.

Example 7

The bonded wafer prepared in Example 1 was heat treated for 60 minutes at 1,200° C. in an argon atmosphere. Cross-sections of the wafer were evaluated before and after the heat treatment by transmission electron microscopy (TEM). The TEM image obtained is shown in FIG. 1. As indicated in FIG. 1, the above treatment removed the BOX oxide film, yielding a DSB wafer.

The present invention permits the manufacturing of high-quality SOI wafers and DSB wafers.

Although the present invention has been described in considerable detail with regard to certain versions thereof, other versions are possible, and alterations, permutations and equivalents of the version shown will become apparent to those skilled in the art upon a reading of the specification and study of the drawings. Also, the various features of the versions herein can be combined in various ways to provide additional versions of the present invention. Furthermore, certain terminology has been used for the purposes of descriptive clarity, and not to limit the present invention. Therefore, any appended claims should not be limited to the description of the preferred versions contained herein and should include all such alterations, permutations, and equivalents as fall within the true spirit and scope of the present invention.

Having now fully described this invention, it will be understood to those of ordinary skill in the art that the methods of the present invention can be carried out with a wide and equivalent range of conditions, formulations, and other parameters without departing from the scope of the invention or any embodiments thereof.

All patents and publications cited herein are hereby fully incorporated by reference in their entirety. The citation of any publication is for its disclosure prior to the filing date and should not be construed as an admission that such publication is prior art or that the present invention is not entitled to antedate such publication by virtue of prior invention.

Unless otherwise stated, a reference to a compound or component includes the compound or component by itself, as well as in combination with other compounds or components, such as mixtures of compounds.

As used herein, the singular forms "a," "an," and "the" include the plural reference unless the context clearly dictates otherwise.

Except where otherwise indicated, all numbers expressing quantities of ingredients, reaction conditions, and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present invention. At the very least, and not to be considered as an attempt to limit the application of the doctrine of equivalents to the scope of the claims, each numerical parameter should be construed in light of the number of significant digits and ordinary rounding conventions.

Additionally, the recitation of numerical ranges within this specification is considered to be a disclosure of all numerical values and ranges within that range. For example, if a range is from about 1 to about 50, it is deemed to include, for example, 1, 7, 34, 46.1, 23.7, or any other value or range within the range.

What is claimed is:

1. A method of manufacturing a bonded wafer comprising:
   forming an oxide film on at least one surface of a base wafer through oxidation,
   bonding the base wafer on which the oxide film has been formed to a top wafer to form a bonded wafer, and
   thinning the top wafer included in the bonded wafer, wherein
      the oxidation comprises heating the base wafer to a heating temperature ranging from 800 to 1300° C. at a rate of temperature increase ranging from 1 to 300° C./second in an oxidizing atmosphere, and holding the base wafer for 1 to 3 minutes at the heating temperature and then lowering a temperature at a rate of temperature reduction ranging from 50 to 100° C./second and
      wherein the bonding is carried out so as to position the oxide film formed in the oxidation at an interface of the top wafer and the base wafer.

2. The method of manufacturing a bonded wafer of claim 1, wherein the oxidation is carried out in a Rapid Thermal Processor.

3. The method of manufacturing a bonded wafer of claim 1, wherein the oxidation is carried out so as to form an oxide film on at least one surface of the base wafer so that the total thickness of the oxide film position at the interface is equal to or less than 30 nm.

4. The method of manufacturing a bonded wafer of claim 1, wherein the heating temperature in the oxidation ranges from 1000 to 1200° C.

5. The method of manufacturing a bonded wafer of claim 1, wherein the thinning is conducted by, prior to the bonding, implanting light element ions into a top wafer to form an ion implantation layer in the top wafer, and following the bonding, subjecting the bonded wafer to heat treatment to separate a portion of the top wafer from the bonded wafer at the ion implantation layer as boundary.

6. The method of manufacturing a bonded wafer of claim 1, wherein the thinning is conducted by, prior to the bonding, implanting oxygen ions into a top wafer to form an ion implantation layer in the top wafer, and following the bonding, removing a portion of the top wafer from the bonded wafer at the ion implantation layer as boundary by grinding, polishing and/or etching.

7. The method of manufacturing a bonded wafer of claim 1, which further comprises removing the oxide film present at the interface by subjecting the bonded wafer to heat treatment in a non-oxidizing atmosphere.

* * * * *